(12) United States Patent
Takahashi et al.

(10) Patent No.: US 6,791,116 B2
(45) Date of Patent: Sep. 14, 2004

(54) LIGHT EMITTING DIODE

(75) Inventors: Yuji Takahashi, Aichi-ken (JP);
Shigeru Fukumoto, Aichi-ken (JP);
Katsunori Arakane, Aichi-ken (JP);
Atsuo Hirano, Aichi-ken (JP);
Kunihiro Hadame, Aichi-ken (JP);
Kunihiko Obara, Kagoshima-ken (JP);
Toshihide Maeda, Kagoshima-ken (JP);
Hiromi Kitahara, Kagoshima-ken (JP);
Kenichi Koya, Kagoshima-ken (JP);
Yoshinobu Yamanouchi,
Kagoshima-ken (JP)

(73) Assignees: Toyoda Gosei Co., Ltd., Aichi-ken
(JP); **Matsushita Electric Industrial
Co., Ltd.**, Osaka (JP)

( * ) Notice: Subject to any disclaimer, the term of this patent is extended or adjusted under 35 U.S.C. 154(b) by 0 days.

(21) Appl. No.: 10/424,137

(22) Filed: Apr. 28, 2003

(65) Prior Publication Data

US 2003/0214233 A1 Nov. 20, 2003

(30) Foreign Application Priority Data

Apr. 30, 2002 (JP) ........................ 2002-128790
Sep. 20, 2002 (JP) ........................ 2002-276184

(51) Int. Cl.$^7$ ............................................. H01L 27/15
(52) U.S. Cl. ............................ 257/79; 257/98; 257/100
(58) Field of Search ............................ 257/79, 98, 100

(56) References Cited

U.S. PATENT DOCUMENTS 5,962,971 A    10/1999   Chen .......................... 313/512
2003/0214233 A1 * 11/2003  Takahashi et al. .......... 313/512

FOREIGN PATENT DOCUMENTS

JP     3048368 U      2/1998
JP     10-190065 A  * 7/1998
JP     3065263        5/2000

OTHER PUBLICATIONS

English language translation (by computer) of Japanese Kokai 10–190065 (Jul. 1998).*

* cited by examiner

*Primary Examiner*—Mark V. Prenty
(74) *Attorney, Agent, or Firm*—McGinn & Gibb, PLLC

(57) ABSTRACT

In a light emitting diode, a scattering material-containing light guiding/scattering layer is provided which directly receives light emitted from a light emitting element. The scattering material contained in the light guiding/scattering layer irregularly reflects and scatters the incident light. The scattered light is led to a fluorescence emitting layer formed of a transparent binder containing a phosphor material. The probability of incidence of light having high optical density, which has been emitted from the light emitting element, directly to the phosphor material contained in the fluorescence emitting layer is lowered, and light can be radiated from the whole fluorescence emitting layer. Therefore, uniform light having a desired color can be radiated with high efficiency from the light emitting diode.

15 Claims, 8 Drawing Sheets

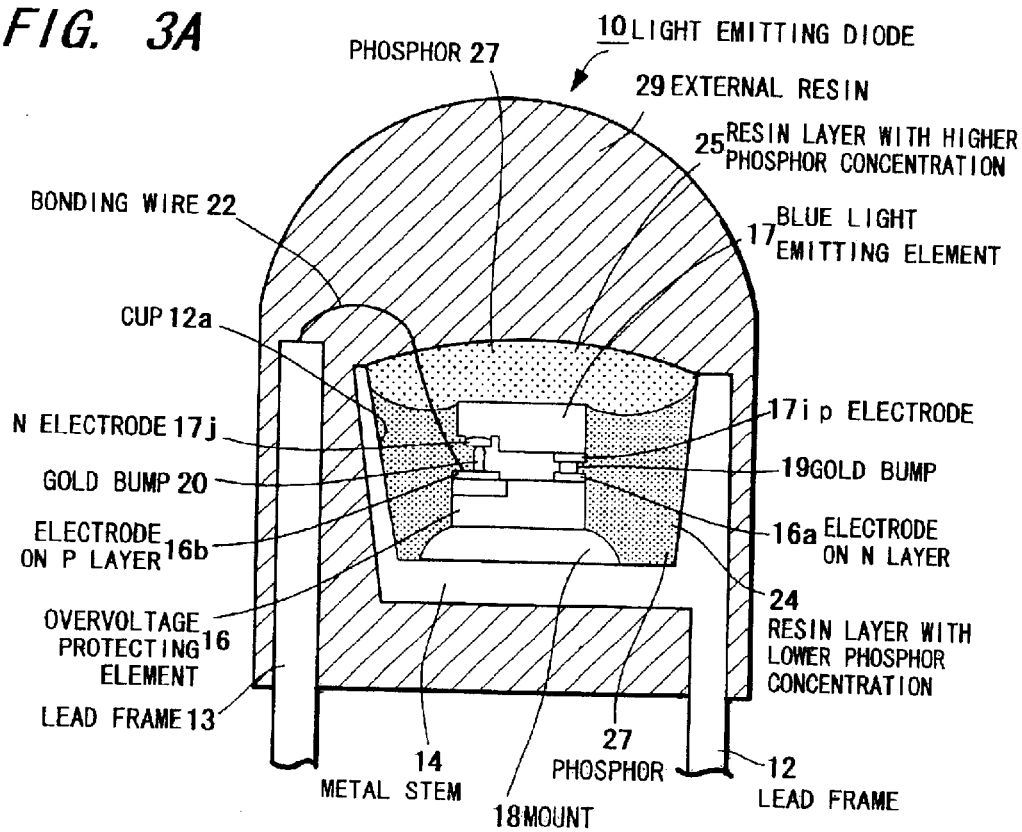
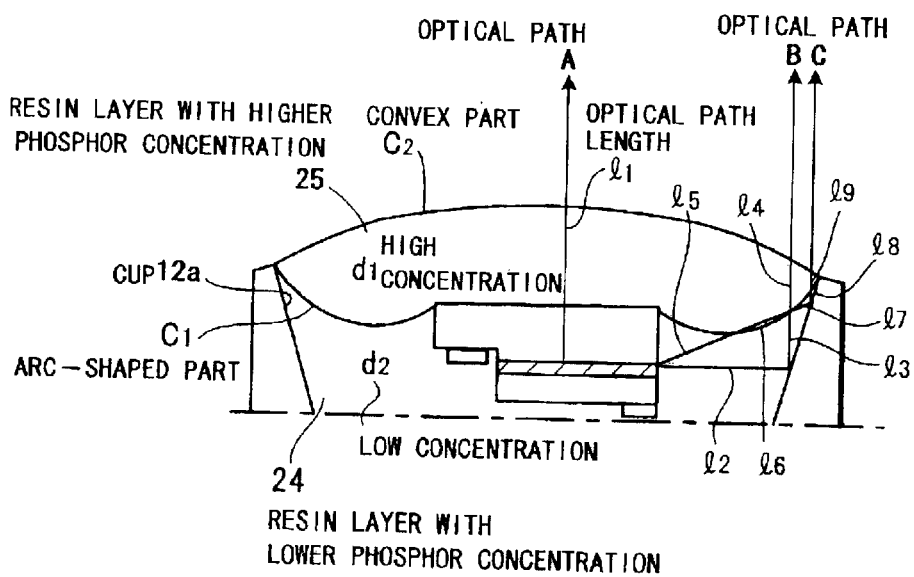

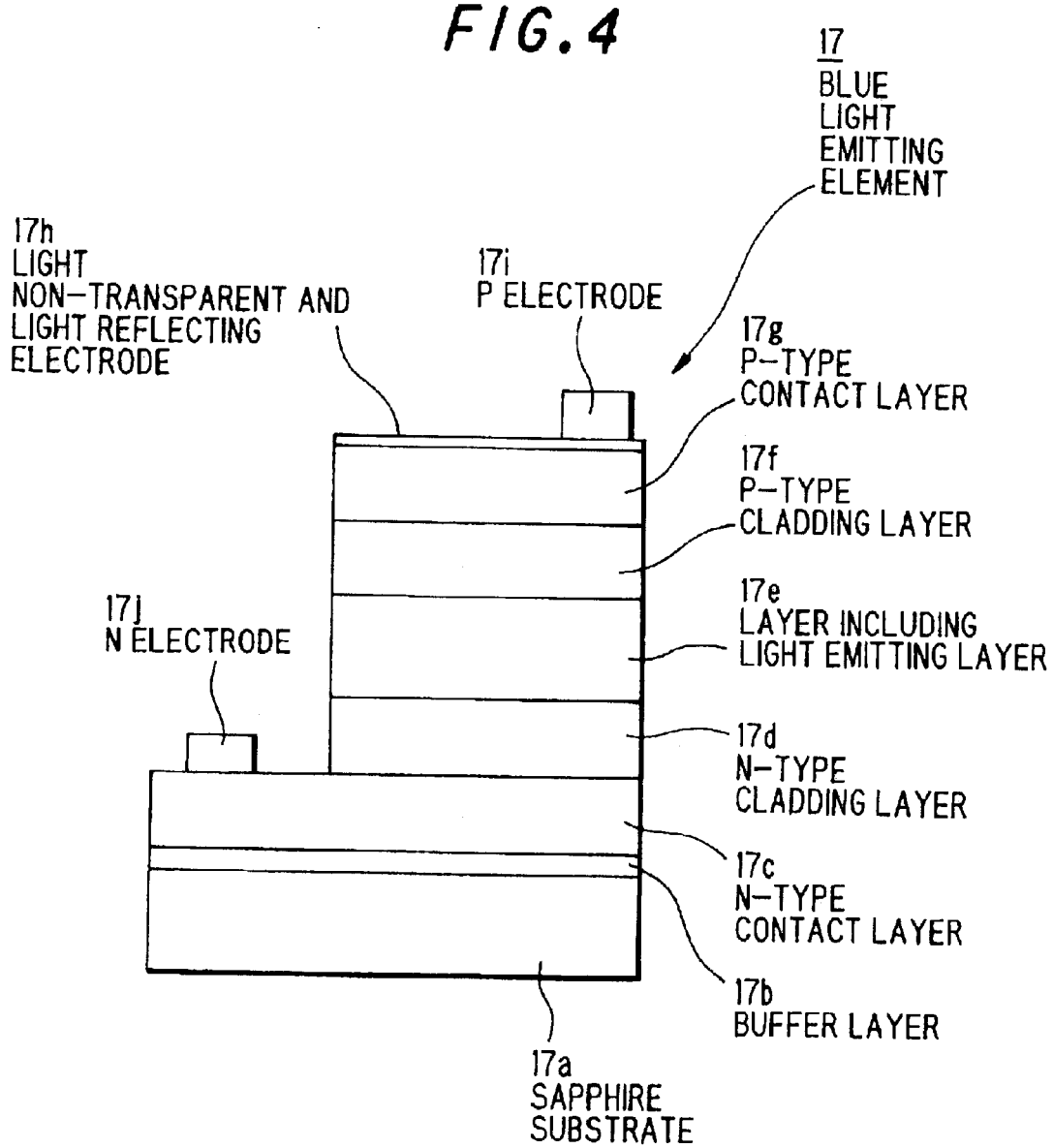

LIGHT EMITTING DIODE

The present application is based on Japanese Patent Applications No.2002-128790 and No.2002-276184, the entire contents of which are incorporated herein by reference.

BACKGROUND OF THE INVENTION

1. Field of the Invention

The invention relates to a light emitting diode which is usable, for example, in light sources for photosensors, printers, and backlights of various displays and the like. More particularly, the invention is concerned with a light emitting diode including a light emitting element and a phosphor material, in which light of a desired uniform color can be radiated from the light emitting diode as viewed from an emission observing surface of the light emitting diode.

In this specification, an LED chip per se is referred to as "light emitting element," and the whole system including an LED chip-mounted package resin or lens system or other optical system is referred to as "light emitting diode."

2. Related Art

A conventional light emitting diode, which uses a light emitting element and a phosphor to emit light of a desired color, is schematically shown in FIG. 1. This light emitting diode includes a pair of lead frames 102, 103. The lead frame 102 has a concave part in its leading end. A light emitting element 101 is mounted on the bottom of the concave part. The light emitting element 101 is covered with a phosphor-mixed resin 104. Further, the space within of the concave part is filled with the phosphor-mixed resin 104. The phosphor-mixed resin 104 is a resin, such as a transparent epoxy resin, into which a phosphor has been mixed. This phosphor absorbs light emitted from the light emitting element 101, performs wavelength conversion of the absorbed light, and gives off light with a wavelength different from the absorbed light. The whole assembly has been sealed with a sealing resin 105.

In the light emitting diode having the above construction, assuming that, for example, the light emitting element 101 is a blue light emitting element and the phosphor is one which absorbs blue light emitted from the blue light emitting element, performs wavelength conversion of the blue light and gives off yellow light, the blue light emitted from the blue light emitting element is mixed with the yellow light given off from the phosphor. Therefore, theoretically, white light can be radiated to the outside of the light emitting diode as viewed from an emission observing surface of the light emitting diode.

This light emitting diode, however, suffers from a problem that, as viewed from the emission observing surface of the light emitting diode, color of light radiated from the light emitting diode varies from position to position of the emission observing surface of the light emitting diode. The above unfavorable phenomenon will be hereinafter referred to as "lack of uniformity of color of radiated light." This problem is attributable to the following fact. A part of light is radiated from the light emitting element 101 in a direction just above the light emitting element 101. Another part of light is radiated obliquely from the top surface or side surface of the light emitting element 101. Further, after emission from the light emitting element 101, a part of light is reflected from the inner wall of the concave part. Therefore, the amount of the phosphor, in the phosphor-mixed resin 104, through which the light is passed in a period between the emission of the light from the light emitting element and the emergence of the light from the light emitting diode varies depending upon optical paths through which the light is passed and radiated to the outside of the light emitting diode. This variation in the amount of phosphor will be hereinafter often referred to as "a difference in the amount of light-permeated phosphor among the optical paths." In this case, as viewed from the emission observing surface side of the light emitting diode, the emission observing surface in its portion just above the light emitting element 101 is perceived as emitting white light, and a portion around that portion just above the light emitting element 101 is perceived as emitting yellow light. Thus, the light radiated from the light emitting diode lacks in uniformity of color.

In particular, in recent years, there is an ever-increasing demand for a reduction in size and a reduction in thickness of the light emitting diode. To meet this demand, for example, shell-shaped or SMD (surface mounted device) type light emitting diodes have been desired in the art. In this case, in order to realize the small and thin light emitting diode, the concentration of the phosphor in the phosphor-mixed resin, which covers the light emitting element and fills up the space within the concave part, should be enhanced. The enhancement in the concentration of the phosphor in the phosphor-mixed resin can certainly meet the demand for a reduction in size and a reduction in thickness of the light emitting diode. In this case, however, the difference in the amount of light-permeated phosphor among the optical paths is further increased. Therefore, the lack of uniformity of color of radiated light becomes more significant.

Japanese Patent No. 3065263 proposes a light emitting diode which reduces the lack of uniformity of color of radiated light. This light emitting diode is shown in FIG. 2. As shown in FIG. 2, the light emitting diode includes a reflecting member 127 having a concave part. A light emitting element 123 is mounted on the bottom of the concave part. The light emitting element 123 is provided with a pair of electrodes (not shown). These electrodes are bonded respectively to external electrodes 124 through electrically connecting members 126. The light emitting element 123 and the electrically connecting members 126 are covered with and are embedded in a first resin 121. The first resin 121 is in a concave spherical surface as viewed from an emission observing surface of the light emitting diode. The remaining space, on the first resin 121, of the concave part is filled with a second resin 122 which is a phosphor-mixed resin. The claimed advantage of this construction is to substantially reduce the difference in the amount of light-permeated phosphor among the optical paths, and thus to reduce the lack of uniformity of color of light radiated from the light emitting diode.

In the above light emitting diode, however, the thickness of the phosphor-containing second resin 122 is the largest in a portion just above the light emitting element 123 and gradually decreases toward the side wall of the concave part. A part of light emitted from the light emitting element 123 is radiated in a direction just above the light emitting element 123 to the outside of the light emitting diode through the second resin 122 in its large thickness portion. On the other hand, another part of light emitted from the light emitting element 123 advances toward the inner wall of the reflecting member 127, is reflected from the side wall of the concave part, and advances toward the outside of the light emitting diode through the second resin 122 in its small thickness portion. Therefore, regarding the emitted light passed through an optical path including the small-thickness portion of the second resin 122, the amount of light-permeated phosphor is smaller than that in the emitted light passed through the other optical paths. That is, a difference in the amount of light-permeated phosphor among optical paths exists, and, thus, the light radiated from the light emitting diode lacks in uniformity of color. In other words, also in the above light emitting diode, light radiated from the light emitting diode disadvantageously lacks in uniformity of color as viewed from the emission observing surface of the light emitting diode.

Further, in the above light emitting diode, light emitted from the light emitting element 123 is directly incident in a high-optical density state to the phosphor mixed second resin 122. According to experiments conducted by the present inventors, for many phosphor materials, the emission efficiency is likely to decrease with the increasing the quantity of light absorbed (optical density). As a result, it was confirmed that, even when the brightness of light emitted from the light emitting element has been increased, the emission efficiency of the phosphor material is saturated at a predetermined value and cannot be enhanced. For this reason, in the above conventional light emitting diode, the radiation of light having a predetermined color through wavelength conversion using a phosphor material with high emission efficiency could not have been realized without difficulties.

SUMMARY OF THE INVENTION

Under the above circumstances, the invention has been made, and it is an object of the invention to provide a light emitting diode which can eliminate the problem of lack of uniformity of color of radiated light involved in the prior art and can radiate light having a desired uniform color as viewed from an emission observing surface of the light emitting diode.

It is another object of the invention to provide a light emitting diode which can realize emission of light from a phosphor material with high efficiency and can realize high-brightness light of a predetermined color.

According to the first feature of the invention, a light emitting diode comprises: a reflecting mirror having a concave part; a light emitting element disposed within the concave part of the reflecting mirror; a light transparent layer formed of a first light transparent material which has been filled into a space within the concave part of the reflecting mirror so as to cover the light emitting element; and a fluorescence emitting layer provided on the light transparent layer on its emission observing surface side, said fluorescence emitting layer being formed of a second light transparent material which is different from the first light transparent material, said second transparent material containing a phosphor material that absorbs light which has been passed through the light transparent layer and emits light with a wavelength different from the absorbed light.

According to the above construction, since the first light transparent material is different from the second light transparent material, light is irregularly reflected from the interface of the first light transparent material and the second light transparent material, because the refractive index of the first light transparent material is different from that of the second transparent material. As a result, the probability of incidence of light having high optical density, which has been emitted from the light emitting element, directly to the phosphor material contained in the fluorescence emitting layer is lowered, and, instead, the probability of incidence of this light in a dispersed state to the phosphor material contained in the fluorescence emitting layer is increased. Therefore, the light can be introduced in various directions from the light transparent layer into the fluorescence emitting layer to enhance the emission efficiency of the whole fluorescence emitting layer, and light having a uniform color can be radiated from the light emitting diode as viewed from the emission observing surface of the light emitting diode.

According to the second feature of the invention, a light emitting diode comprises: a reflecting mirror having a concave part; a light emitting element disposed within the concave part of the reflecting mirror; a first layer formed of a phosphor material-containing light transparent material which has been filled into a space within the concave part of the reflecting mirror to the level of the upper surface of the light emitting element disposed within the concave part of the reflecting mirror; and a second layer formed of a phosphor material-containing light transparent material which is provided on the first layer on its emission observing surface side, said phosphor material contained in the first and second layers being capable of absorbing light emitted from the light emitting element and emitting light with a wavelength different from the absorbed light, the concentration of the phosphor in the second layer being higher than the concentration of the phosphor in the first layer.

According to the above construction, lights emitted in various directions from the light emitting element are substantially equal to one another in the amount of phosphor through which the lights are passed in a period between the emission from the light emitting element and the radiation from the light emitting diode after passage through the first and the second layers. Therefore, during passage through the first and second layers, light given off from the phosphor after wavelength conversion can be uniformly mixed with light not passed through the phosphor, and, thus, light having a desired color can be uniformly radiated from the light emitting diode as viewed from an emission observing surface of the light emitting diode.

According to the third feature of the invention, a light emitting diode comprises: a reflecting mirror having a concave part; a light emitting element disposed within the concave part of the reflecting mirror; and a phosphor material-containing light transparent material layer which has been filled into a space within the concave part of the reflecting mirror so as to cover the light emitting element, said phosphor material being capable of absorbing light emitted from the light emitting element and emitting light with a wavelength different from the absorbed light, said phosphor material having been distributed in said light transparent material layer so that values obtained by multiplying the length of optical paths, through which lights emitted from the light emitting element are passed and reach the upper surface of the light transparent material layer, by the concentration of the phosphor material are substantially equal to one another.

According to the above construction, lights emitted in various directions from the light emitting element are substantially equal to one another in the amount of phosphor through which the lights are passed in a period between the emission from the light emitting element and the radiation from the light emitting diode after passage through the light transparent material. Therefore, during passage through the light transparent material, light given off from the phosphor after wavelength conversion can be uniformly mixed with light not passed through the phosphor, and, thus, light having a desired color can be uniformly radiated from the light emitting diode as viewed from an emission observing surface of the light emitting diode.

According to the fourth feature of the invention, a light emitting diode comprises: a reflecting mirror having a concave part; a light emitting element disposed within the concave part of the reflecting mirror; a transparent light guiding/scattering layer which has been filled into a space within the concave part of the reflecting mirror so as to cover the light emitting element, said transparent light guiding/ scattering layer being capable of scattering in various directions light emitted from the light emitting element; and a phosphor material-containing transparent fluorescence emitting layer which is provided on the light guiding/scattering layer in its emission observing surface side, said phosphor material being capable of absorbing light, which has been emitted from the light emitting element and passed through the light guiding/scattering layer, and capable of emitting light with a wavelength different from the absorbed light.

According to the above construction, the probability of incidence of light having high optical density, which has been emitted from the light emitting element, directly to the phosphor material contained in the fluorescence emitting layer is lowered, and, instead, the probability of incidence of this light in a dispersed state to the phosphor material contained in the fluorescence emitting layer is increased. Therefore, the light can be introduced in various directions from the light guiding/scattering layer into the fluorescence emitting layer to enhance the emission efficiency of the whole fluorescence emitting layer, and light having a desired uniform color can be radiated from the light emitting diode as viewed from the emission observing surface of the light emitting diode.

BRIEF DESCRIPTION OF THE DRAWINGS

The invention will be explained in more detail in conjunction with the appended drawings, wherein:

FIG. 3A is a cross-sectional view showing the construction of a light emitting diode in a first preferred embodiment of the invention;

FIG. 3B is a diagram illustrating optical path lengths of lights emitted from a light emitting element used in the light emitting diode shown in FIG. 3A;

FIG. 4 is a diagram showing the layer construction of a blue light emitting element used in the light emitting diode in the first preferred embodiment of the invention;

DESCRIPTION OF THE PREFERRED EMBODIMENTS

Figure 1:
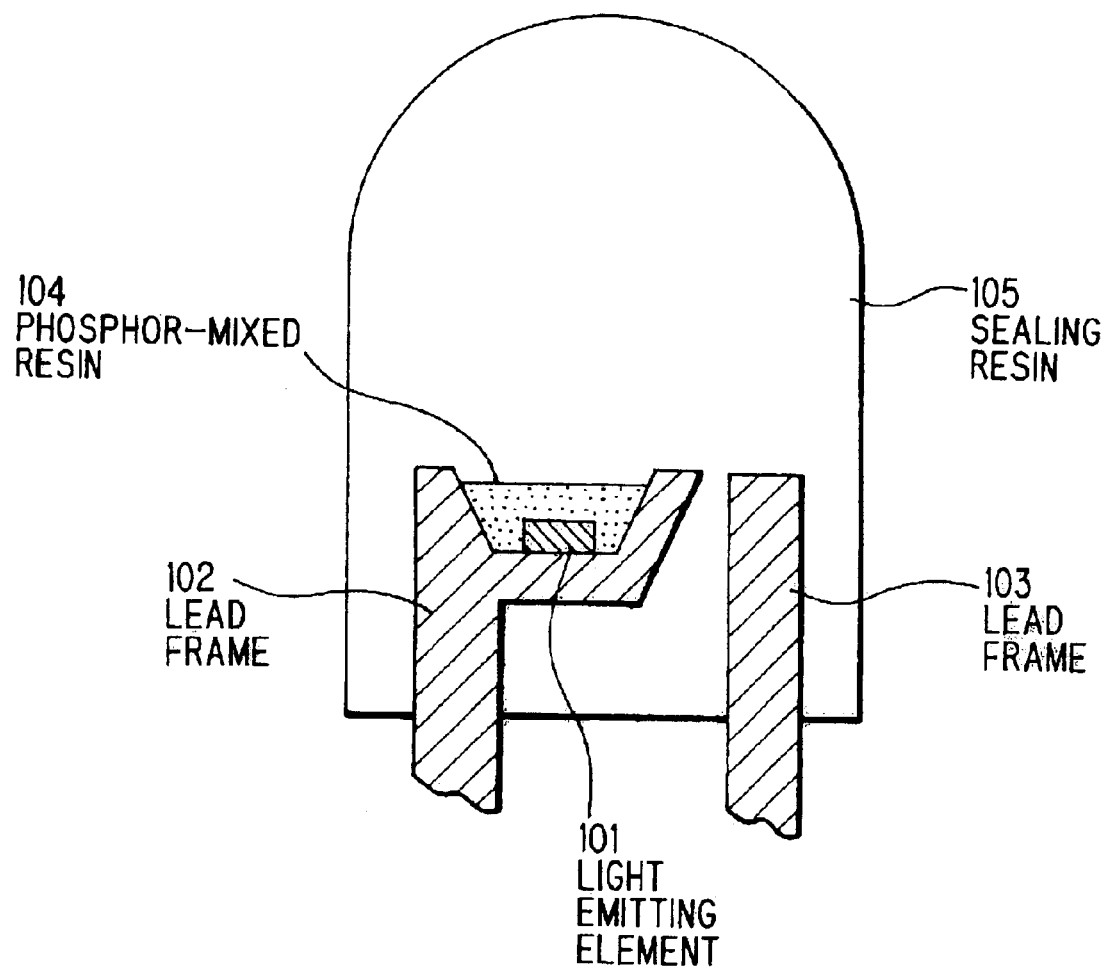
FIG. 1 is a cross-sectional view of an example of a conventional light emitting diode which utilizes a light emitting element and a phosphor to radiate light having a desired color.
Figure 2:
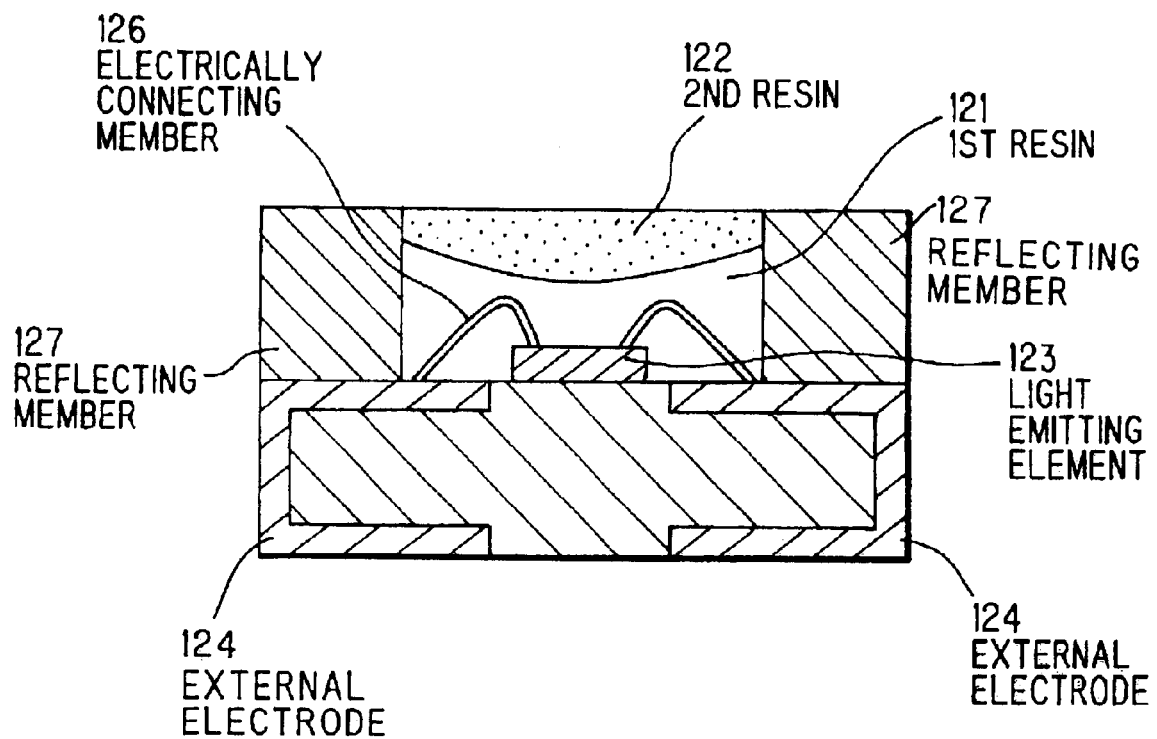
FIG. 2 is a cross-sectional view of another example of a conventional light emitting diode which utilizes a light emitting element and a phosphor to radiate light having a desired color.

Preferred embodiments of the invention will be explained in conjunction with the accompanying drawings.

First Preferred Embodiment

FIG. 3A is a cross-sectional view showing the construction of a light emitting diode in a first preferred embodiment of the invention.

A light emitting diode 10 shown in this drawing is of shell type and includes two lead frames 12, 13 which are electrically insulated from each other. A metal stem 14 provided with a concave cup 12a is provided at the leading end of the lead frame 12. The inner wall surface of the cup 12a functions as a reflecting mirror which reflects light. A flip chip-type light emitting element is mounted on the bottom of the cup 12a. The flip chip-type light emitting element comprises a blue light emitting element 17 which has been flip chip mounted onto an overvoltage protecting element 16. More specifically, the overvoltage protecting element 16 is fixed onto the bottom of the cup 12a through a mount 18 of a conductive paste. A blue light emitting element 17, which emits blue light with a wavelength of 450 to 550 nm, has been flip chip mounted on the overvoltage protecting element 16.

The layer construction of the blue light emitting element 17 is shown in FIG. 4. As shown in FIG. 4, for example, a sapphire substrate 17a is provided as a transparent substrate. For example, a buffer layer 17b, an n-type contact layer 17c, an n-type cladding layer 17d, a layer 17e including a light emitting layer, a p-type cladding layer 17f, and a p-type contact layer 17g are formed as nitride semiconductor layers, for example, by MOCVD (metal-organics chemical vapor deposition) in that order on the sapphire substrate 17a. For example, by sputtering or vacuum deposition, a light nontransparent and light reflecting electrode 17h is formed on the whole surface of the p-type contact layer 17g, a p electrode 17i is formed on a part of the light nontransparent and light reflecting electrode 17h, and an n electrode 17j is formed on a part of the n-type contact layer 17c.

The flip chip mounting of this blue light emitting element 17 is carried out as follows. As shown in FIG. 3A, the lower surface of the sapphire substrate 17a shown in FIG. 4 is provided as the uppermost surface. The p electrode 17i in the blue light emitting element 17 shown in FIG. 4 is connected to an electrode 16a on an n layer in the overvoltage protecting element 16 through a gold bump 19. The n electrode 17j is connected to an electrode 16b on a p layer in the overvoltage protecting element 16 through a gold bump 20. The electrode 16b in the overvoltage protecting element 16 is connected to the lead frame 13 through a bonding wire 22.

A resin layer 24 with a lower phosphor concentration, which will be explained later, is filled into the space within the cup 12a to the level of the uppermost surface of the blue light emitting element 17. A resin layer 25 with a higher phosphor concentration is provided on the resin layer 24 with a lower phosphor concentration to such a level that, in the cross section, the center portion is bulged from the top level of the cup 12a. More specifically, as viewed from above the top of the blue light emitting element 17, the resin layer 24 with a lower phosphor concentration is provided in a ring form around the uppermost surface of the blue light emitting element 17. As viewed in the cross section, the upper surface of the resin layer 24 with a lower phosphor concentration on both sides of the blue light emitting element 17 is in an arcuately concaved form. As viewed in the cross section, the upper surface of the resin layer 25 with a higher phosphor concentration is in such a convex form that the portion just above the blue light emitting element 17 is bulged on the highest level. The whole assembly has been sealed with an external resin 29 to form a shell-shaped light emitting diode 10.

The resin layer 24 with a lower phosphor concentration is formed of a light transparent resin, such as an epoxy resin or a silicone resin, into which a phosphor 27, which absorbs blue light emitted from the blue light emitting element 17 and emits yellow light, has been mixed in a lower concentration than that in the resin layer 25. The resin layer 25 with a higher phosphor concentration is formed of a light transparent resin into which the phosphor 27 has been mixed in a higher phosphor concentration than that in the resin layer 24. The phosphor 27 may be a Ce:YAG (yttrium-aluminum-garnet) phosphor. Examples of additional phosphor materials usable herein include rare earth phosphors, such as yttrium (Y), gadolinium (Gd), and cerium (Ce), inorganic phosphors, organic phosphors, fluorescent dyes, and fluorescent pigments.

The concentration of the phosphor 27 in the layers 24, 25 or the form of the layers 24, 25 has been regulated so that values obtained by multiplying the lengths of optical paths, through which lights emitted from the blue light emitting element 17 reach the interface of the resin layer 25 with a higher phosphor concentration and the external resin 29, by the concentration of the phosphor 27 are substantially equal to one another.

This will be explained in conjunction with FIG. 3B illustrating the length of optical paths of lights emitted from the light emitting element. For example, for three optical paths A, B, and C shown in FIG. 3B, multiplication values A', B', and C' are substantially equal to one another, wherein A' represents the multiplication value obtained by multiplying the length of the optical path A by the concentration of the phosphor 27, B' represents the multiplication value obtained by multiplying the length of the optical path B by the concentration of the phosphor 27, and C' represents the multiplication value obtained by multiplying the length of the optical path C by the concentration of the phosphor 27. In FIG. 3B, $l_1$ to $l_9$ each represent an optical path length, $d_1$ represents a high concentration, $d_2$ represents a low concentration, $C_1$ represents an arc part, and $C_2$ represents a convex part. In this case, for the path A of light which is emitted in a direction just above the blue light emitting element 17, $A'=l_1 \times d_1$. For the path B of light which is emitted from the side face of the blue light emitting element 17 and then reflected from the side wall of the cup 12a, $B'=(l_2+l_3)d_2+l_4 \times d_1$. Further, for the path C of light which is emitted from the side face of the blue light emitting element 17, passed through the resin layer 24 with a lower phosphor concentration, then passed through the arc part of the resin layer 25 with a higher phosphor concentration, further passed through the resin layer 24 with a lower phosphor concentration, and reflected from the side wall of the cup 12a to provide reflected light which is then passed through the resin layer 24 with a lower phosphor concentration, and then passed through the resin layer 25 with a higher phosphor concentration, $C'=(l_5+l_7+l_8)d_2+(l_6+l_9)d_1$. In this case, the relationship among A', B', and C' is $A' \approx B' \approx C'$.

The resin, into which the phosphor 27 has been mixed, may be prepared, for example, by mixing a main agent as a light transparent resin and a curing agent together at a predetermined ratio, stirring and defoaming the mixture, mixing the resin with Aerosil and a silane coupling agent together, and thoroughly kneading the mixture. An embodiment, wherein this resin is used for the formation of the layers 24, 25, will be explained. For example, assuming that the depth of the cup 12a is 0.35 mm and the height of the flip chip-type light emitting element is 0.25 mm, the concentration of the phosphor 27 in the resin layer 24 with a lower phosphor concentration is brought to 20% while the concentration of the phosphor 27 in the resin layer 25 with a higher phosphor concentration is brought to 60%. In the formation of each of the layers 24, 25, curing is carried out at 120° C. for one hr.

In the light emitting diode 10 having the above construction, upon the application of voltage to the lead frames 12, 13, the blue light emitting element 17 emits blue light. In this case, blue light which is emitted in a direction just above the blue light emitting element 17 is different from blue light which is emitted obliquely from the upper surface or side face of the blue light emitting element 17 or blue light which, after emission from the blue light emitting element 17, is reflected from the inner wall of the cup 12a, in the length of optical path through the light is passed through the layers 24, 25.

However, as described above, the concentration of the phosphor 27 in the layers 24, 25 or the form of the layers 24, 25 has been regulated so that values obtained by multiplying the length of optical paths by the concentration of the phosphor 27 are substantially equal to one another. Therefore, lights emitted in the above respective directions from the blue light emitting element 17 are substantially equal to one another in the amount of phosphor 27 through which the light is passed in a period between the emission from the blue light emitting element 17 and the entry of the external resin 29 after the passage through the layers 24, 25. More specifically, when lights emitted from the blue light emitting element 17 are passed through the optical paths A, B, and C, the optical paths A, B, and C are substantially equal to one another in the amount of light-permeated phosphor 27. In each of the optical paths, the light emitted from the blue light emitting element 17 is subjected to wavelength conversion in the phosphor 27 which emits yellow light. The yellow light is mixed with blue light, which is emitted from the blue light emitting element 17 but not passed through the phosphor 27. Therefore, the radiation of uniform white light from the light emitting diode 10 can be realized as viewed from the emission observing surface of the light emitting diode 10.

In this preferred embodiment, the light nontransparent and light reflecting electrode 17h has been formed on the whole surface of the upper surface of the p-type contact layer 17g in the blue light emitting element 17. Alternatively, a light transparent electrode may be used instead of the light nontransparent and light reflecting electrode 17h.

Second Preferred Embodiment

Figure 5:
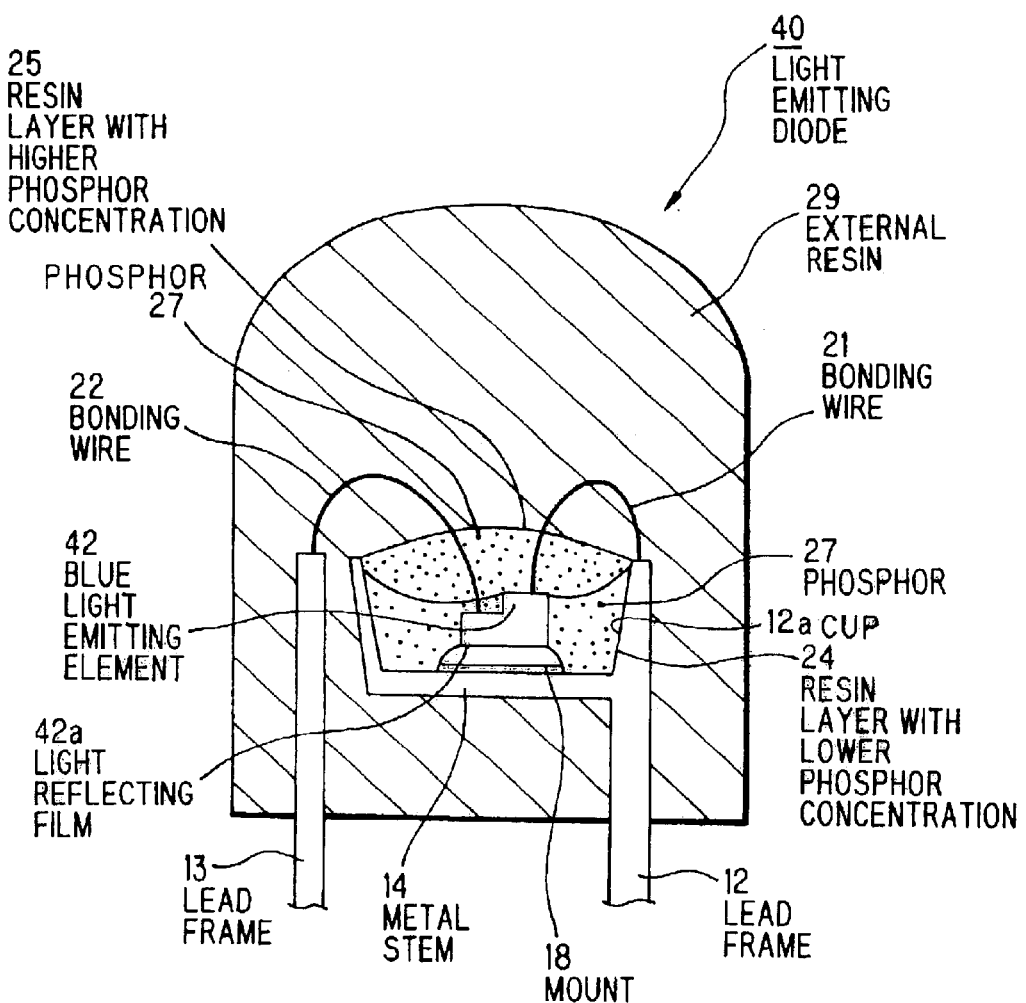
FIG. 5 is a cross-sectional view showing the construction of a light emitting diode in a second preferred embodiment of the invention.

FIG. 5 is a cross-sectional view showing the construction of a light emitting diode in a second preferred embodiment of the invention. In FIG. 5 showing the light emitting diode in the second preferred embodiment and FIG. 3A showing the light emitting diode in the first preferred embodiment, like parts are identified with the same reference numerals, and the overlapped explanation thereof will be omitted.

A light emitting diode 40 shown in FIG. 5 is different from the light emitting diode shown in FIG. 3A in that, instead of the flip chip-type light emitting element explained in the first preferred embodiment, a blue light emitting element 42 has been fixed onto the bottom of a cup 12a through a mount 18 in a face-up manner. The blue light emitting element 42 is the same as the blue light emitting element 17 shown in FIG. 4, except that a light reflecting film 42a is additionally provided on the lower surface of the sapphire substrate 17a. Further, the p electrode 17i of the blue light emitting element 42 is connected through a bonding wire 21 to a lead frame 12, and the n electrode 17j of the blue light emitting element 42 is connected through a bonding wire 22 to a lead frame 13. This blue light emitting element 42 is configured so that light, which has been emitted in a direction just below the blue light emitting element 42 is reflected from the reflecting film 42a and is radiated in a direction just above the light emitting element 42.

As with the first preferred embodiment, a resin layer 24 with a lower phosphor concentration is filled into the space within the cup 12a to the level of the uppermost surface of the blue light emitting element 42, and a resin layer 25 with a higher phosphor concentration is provided on the resin layer 24 with a lower phosphor concentration so that, as viewed in the cross section, the center portion of the resin layer 25 with a higher phosphor concentration just above the blue light emitting element 42 is bulged from the top level of the cup 12a. Further, the concentration of the phosphor 27 in the layers 24, 25 and the form of the layers 24, 25 have been regulated so that values obtained by multiplying the lengths of optical paths, through which lights emitted from the blue light emitting element 42 reach the interface of the resin layer 25 with a higher phosphor concentration and the external resin 29, by the concentration of the phosphor 27 are substantially equal to one another.

The light emitting diode 40 having the above construction can also attain the same effect as in the light emitting diode 10 in the first preferred embodiment.

Third Preferred Embodiment

Figure 6:
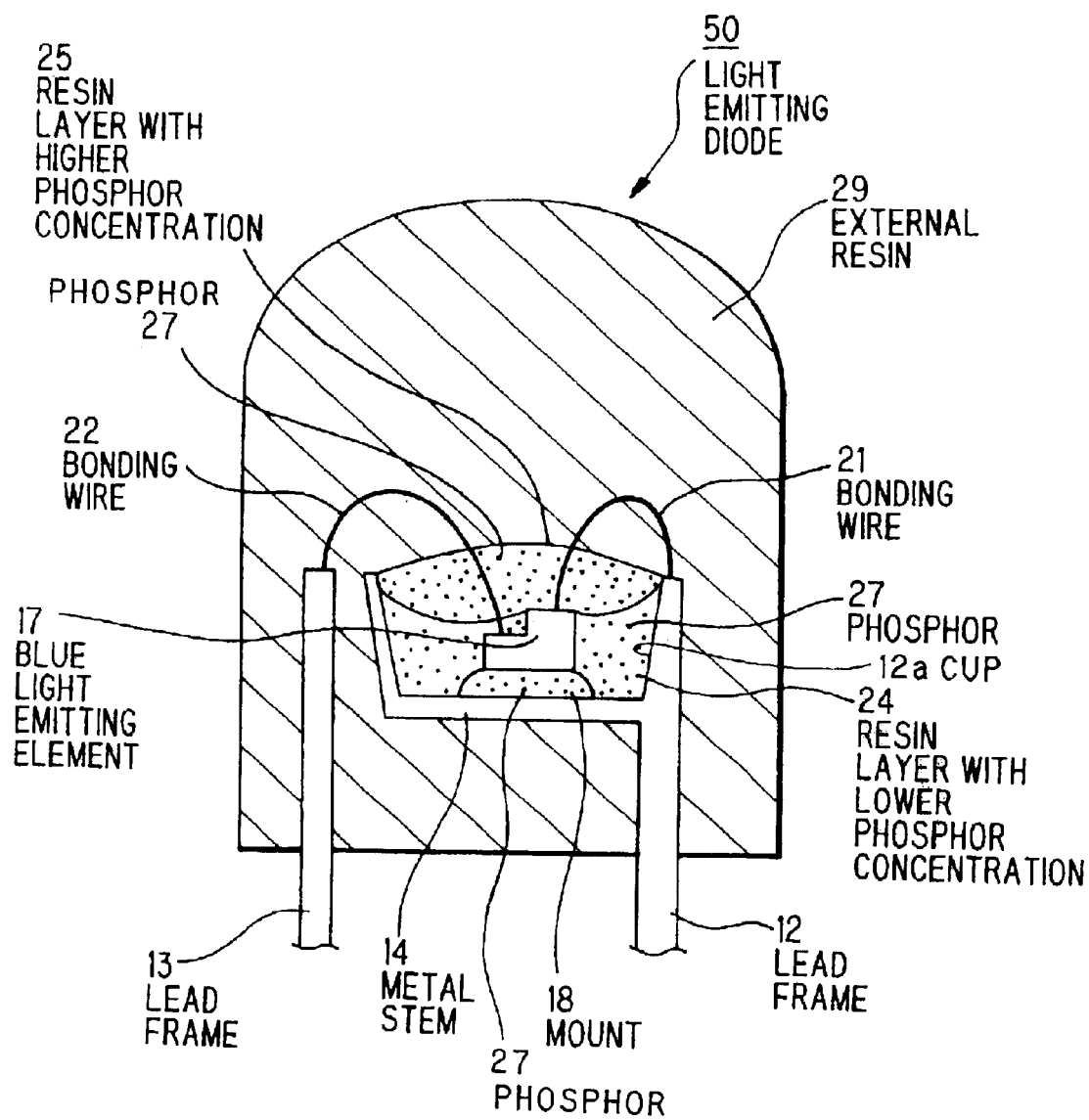
FIG. 6 is a cross-sectional view showing the construction of a light emitting diode in a third preferred embodiment of the invention.

FIG. 6 is a cross-sectional view showing the construction of a light emitting diode in a third preferred embodiment of the invention. In FIG. 6 showing the light emitting diode in the third preferred embodiment and FIG. 5 showing the light emitting diode in the second preferred embodiment, like parts are identified with the same reference characters, and the overlapped explanation thereof will be omitted. A light emitting diode 50 shown in FIG. 6 is different from the light emitting diode shown in FIG. 5 in that, instead of the blue light emitting element 42 explained above in the second preferred embodiment, a blue light emitting element 17 as shown in FIG. 4 has been fixed onto the bottom of a cup 12a through a mount 18. Further, the mount 18 contains a silver (Ag) filler and a phosphor 27. Specifically, blue light, which has been emitted in a direction just below the blue light emitting element 17, is subjected to wavelength conversion by the phosphor 27, contained in the mount 18, which emits yellow light. The yellow light is reflected from the bottom of the cup 12a in a direction just above the mount 18 or in an oblique direction.

Accordingly, the light emitting diode in conjunction with this preferred embodiment can attain the same effect as the light emitting diode in the second preferred embodiment and further can attain the following additional effect. Specifically, blue light emitted in a direction just below the blue light emitting element 17 is once subjected to wavelength conversion by the phosphor 27, contained in the mount 18, which gives off yellow light. The yellow light is then reflected from the bottom of the cup 12a in a direction just above the mount 18 or in an oblique direction. Therefore, the necessary quantity of light to be subjected to wavelength conversion in the phosphor contained in the resin layer 25 with a higher phosphor concentration can be reduced by the quantity of light subjected to wavelength conversion in the phosphor 27 contained in the mount 18, and, thus, the thickness of the resin layer 25 with a higher phosphor concentration can be reduced. The reduction in the thickness of the resin layer 25 with a higher phosphor concentration can realize a further reduction in thickness of light emitting diodes, particularly SMD-type light emitting diodes.

In the light emitting diodes in the first to third preferred embodiments, the incorporation of a reflecting agent, such as spherical glass beads, into the resin layer 24 with a lower phosphor concentration causes irregular reflection of light which can maintain uniformity of light.

In the light emitting diodes of the first to third preferred embodiments, the resin layer has been divided into two layers, the resin layer 24 with a lower phosphor concentration and the resin layer 25 with a higher phosphor concentration. Alternatively, instead of the construction of two layers with different phosphor concentrations, a construction may be adopted wherein the space within the cup 12a is filled with a single-layer light transparent resin of which the concentration of the phosphor 27 has been gradually changed so that values obtained by multiplying the length of optical paths by the concentration of the phosphor 27 are substantially equal to one another.

In the above preferred embodiments, a blue light emitting element has been used as a light emitting element. However, the light emitting element is not limited to the blue light emitting element and may be any light emitting element including ultraviolet light emitting elements so far as the light emitting element emits light with a wavelength which can excite the phosphor. Further, in the light emitting diodes in the above preferred embodiments, a transparent epoxy resin has been used as the light transparent material for sealing the light emitting element and the like. However, other materials including transparent silicone resins may also be used.

Fourth Preferred Embodiment

Figure 7:
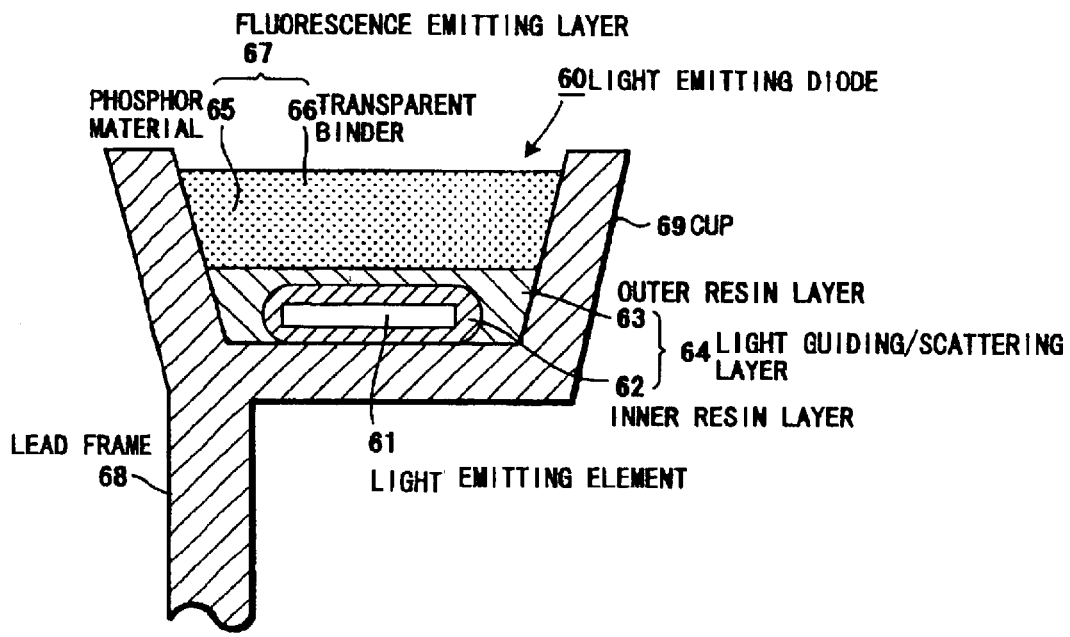
FIG. 7 is a schematic cross-sectional view showing the construction of a light emitting diode in a fourth preferred embodiment of the invention.

FIG. 7 is a schematic cross-sectional view showing the construction of a light emitting diode in a fourth preferred embodiment of the invention.

As shown in FIG. 7, a light emitting diode 60 in this preferred embodiment includes a lead frame 68. A concave cup 69 is provided at the leading end of the lead frame 68. A light emitting element 61 is provided within the cup 69 so that light emitted from the light emitting element 61 can be radiated in a direction above the cup 69.

The light emitting element 61 may be any light emitting element which can emit light with any wavelength in a region from the infrared to the ultraviolet. In particular, a light emitting element, which emits light in an ultraviolet region or in a near-ultraviolet region, is suitable because light emitted from the light emitting element can be efficiently converted to contemplated light without the perception of the light emitted by the light emitting element 61 directly by a viewer. The results of experiments conducted by the present inventors show that, when a near-ultraviolet light emitting element is used as the light emitting element 61 to emit near-ultraviolet light which excites a phosphor material 65 described later, due to relatively short wavelength, energy can be relatively strongly excited, contributing to enhanced emission efficiency. A gallium nitride compound semiconductor material having an emission wavelength band in the range of 360 to 390 nm not harmful to the human body may be used in the near-ultraviolet light emitting element 61. The light emitting element 61 is electrically connected to the cup 69 through a lead wire (not shown).

A transparent binder is coated onto the periphery of the light emitting element 61 to form an inner resin layer 62. The inner resin layer 62 is formed of a material having high adhesion to the light emitting element 61, such as an epoxy resin, an acrylic resin, a urea resin, or a silicone resin. The thickness of the inner resin layer 62 is generally not less than several tens of micrometers. The thickness of the inner resin layer 62, however, may be properly determined by taking into consideration factors such as the number of layers constituting the inner resin layer and the refractive index of the material constituting the layer.

Further, an outer resin layer 63 is provided on the outer periphery of the inner resin layer 62. The outer resin layer 63 is formed of a material having a refractive index different from the inner resin layer 62. The outer resin layer 63 is provided within the cup 69 so as to fill up the space defined by the inner wall of the cup 69 and the light emitting element 61 with the inner resin layer 62 formed thereon and to cover the light emitting element 61 with the inner resin layer 62 formed thereon. The outer resin layer 63 may also be formed of a material such as an epoxy resin, an acrylic resin, a urea resin, or a silicone resin.

In this preferred embodiment, the inner resin layer 62 and the outer resin layer 63 together constitute a light guiding/scattering layer 64. The thickness of the light guiding/scattering layer 64 may be 50 to 300 $\mu$m. In this light guiding/scattering layer 64, the inner resin layer 62 is formed of a material which is different from the outer resin layer 63. According to this construction, light emitted from the light emitting element 61, which is in the state of adhesion to the inner resin layer 62, is incident directly to the inner resin layer 62 and is reflected from and scattered at the interfacial boundary between the inner resin layer 62 and the outer resin layer 63 with high probability and is guided to a fluorescence emitting layer 67 which will be described later. The light guiding/scattering layer 64 may have a multilayer structure of more than two layers or may be formed of a material having a relatively high refractive index. Further, the light emitting diode may take the form of a shell-shaped light emitting diode in which the periphery of the light emitting element has been molded with a resin to form a lens part in the shell-shaped light emitting diode. In this case, the whole or a part of the resin used in the formation of the shell-shaped light emitting diode may constitute the light guiding/scattering layer or one of the layers constituting the light guiding/scattering layer.

The remaining space on the light guiding/scattering layer 64 in the cup 69 with the light emitting element 61 disposed therein is filled with a fluorescence emitting layer 67. The fluorescence emitting layer 67 is formed of a transparent binder 66 containing a phosphor material 65 which gives off light having a desired color. Rare earth phosphors, such as yttrium (Y), gadolinium (Gd), and cerium (Ce), may be used as the phosphor material 65. Examples of other phosphor materials usable herein include inorganic phosphors, organic phosphors, fluorescent dyes, and fluorescent pigments. The fluorescence emitting layer 67 may be formed of a material prepared by mixing and kneading a fine powder of the phosphor material 65 and a transparent binder, such as an epoxy resin, an acrylic resin, a urea resin, or a silicone resin, together. The thickness of the fluorescence emitting layer 67 may also be 10 to 300 $\mu$m. The phosphor material 65 may be mixed into the transparent binder 66 to a concentration of 2 to 20% by volume based on the transparent binder 66. When the concentration of the phosphor material 65 in the transparent binder 66 is low, the fluorescence emitting layer 67 is formed in a large thickness, while when the concentration of the phosphor material 65 in the transparent binder 66 is high, the fluorescence emitting layer 67 is formed in a small thickness.

Thus, in the light emitting diode 60 in this preferred embodiment, in the light guiding/scattering layer 64, light, which has been emitted from the light emitting element 61 and has entered the inner resin layer 62, is reflected from and is scattered at the interfacial boundary between the inner resin layer 62 and the outer resin layer 63 with high probability and is led to the fluorescence emitting layer 67. Therefore, the probability of incidence of light having high optical density, which has been emitted from the light emitting element 61, directly to the phosphor material 65 contained in the fluorescence emitting layer 67 is lowered, and the probability of incidence of this light in a dispersed state to the phosphor material 65 contained in the fluorescence emitting layer 67 is increased. Therefore, the light can be introduced in various directions from the light guiding/scattering layer 64 into the fluorescence emitting layer 67 to enhance the emission efficiency of the whole fluorescence emitting layer 67, and light having a desired uniform color can be radiated from the light emitting diode as viewed from the emission observing surface of the light emitting diode.

In the above preferred embodiment, the light guiding/scattering layer 64 has a two-layer structure. Alternatively, the number of layers constituting the light guiding/scattering layer 64 may be increased to improve light scattering efficiency. In this case, however, the number of layers constituting the light guiding/scattering layer 64 is preferably two to five from the viewpoint of cost effectiveness.

In this preferred embodiment, any phosphor material is not contained in the light guiding/scattering layer 64. However, a suitable amount of a phosphor material may also be contained in the light guiding/scattering layer 64.

Fifth Preferred Embodiment

Figure 8:
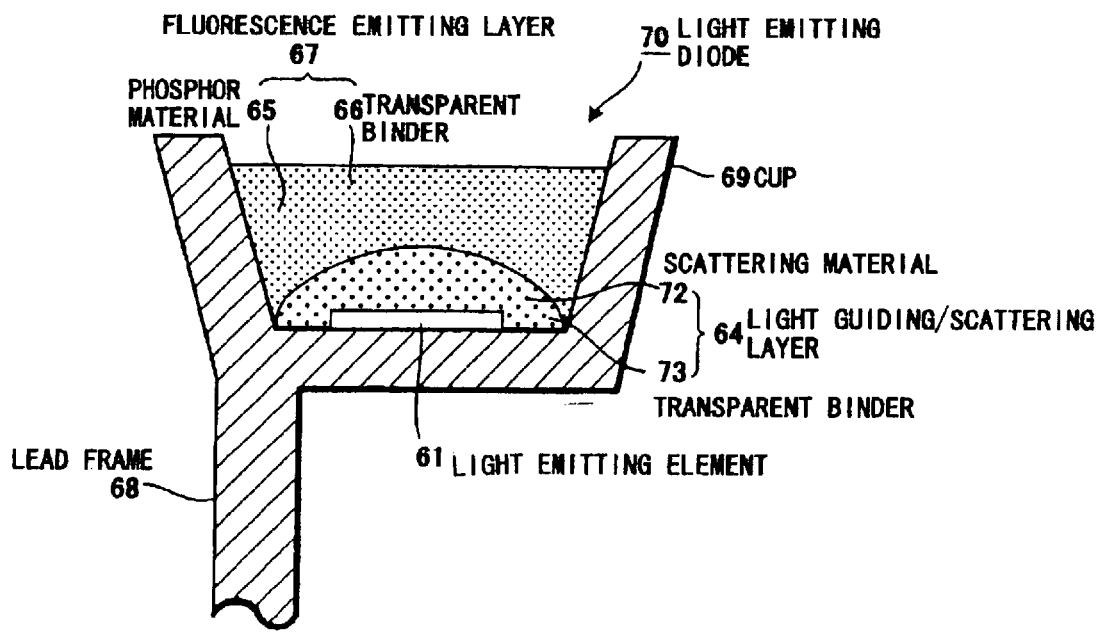
FIG. 8 is a schematic cross-sectional view showing the construction of a light emitting diode in a fifth preferred embodiment of the invention.

FIG. 8 is a schematic cross-sectional view showing the construction of a light emitting diode in a fifth preferred embodiment of the invention. In FIG. 8 showing the light emitting diode in the fifth preferred embodiment of the invention and FIG. 7 showing the light emitting diode in the fourth preferred embodiment of the invention, like parts are identified with the same reference numerals, and the overlapped explanation thereof will be omitted.

In a light emitting diode 70 shown in FIG. 8, a light guiding/scattering layer 64 formed of a transparent binder 73 with a light scattering material 72 incorporated therein is formed on the periphery of the light emitting element 61 as shown in FIG. 7 (fourth preferred embodiment).

The light scattering material 72 for scattering the incident light may be a member selected from the group consisting of aluminum oxide, titanium oxide, barium titanate, and silicon oxide, or a combination of two or more of them.

A material having high adhesion to the light emitting element 61 is selected as the transparent binder 73. Examples of materials usable as the transparent binder 73 include synthetic resins, such as epoxy resins, acrylic resins, urea resins, and silicone resins, and synthetic rubbers.

The light guiding/scattering layer 64 may be formed by mixing and kneading the transparent binder 73 and the scattering material 72 together and pouring the kneaded mixture into a space around the light emitting element 61 disposed within the cup 69. The thickness of the light guiding/scattering layer 64 may be properly determined depending upon the content of the scattering material 72 in the light guiding/scattering layer 64.

In FIG. 8, the light guiding/scattering layer 64 is provided, on the light emitting element 61, in an arc form or a convex lens form, that is, in such a manner that the thickness of the center portion is larger and the thickness of the peripheral portion is smaller. The reason for the adoption of this form of the light guiding/scattering layer is as follows. When the transparent binder 73 having a relatively high surface tension, which can maintain the adhesion of the light emitting element 61, is used and when the thickness of the portion, where the density of light emitted from the light emitting element 61 is high, is made large, the optical density can be homogenized and the brightness of the light radiated from the light guiding/scattering layer 64 formed of the transparent binder 73 with the light scattering material 72 mixed thereinto can be enhanced. The upper surface of the light guiding/scattering layer 64 may be made on a level which is parallel to the opening of the cup 69 (horizontal surface). The thickness of the light guiding/scattering layer 64 may be 50 to 300 µm. As with the fourth preferred embodiment, a fluorescence emitting layer 67 is provided on the upper surface of the light guiding/scattering layer 64.

Thus, according to the light emitting diode 70 in this preferred embodiment, the light scattering material 72 contained in the light guiding/scattering layer 64 can irregularly reflect and scatter the incident light in various directions and can guide the scattered light to the fluorescence emitting layer 67. Therefore, as with the fourth preferred embodiment, by virtue of the provision of the light guiding/scattering layer 64, the probability of incidence of light having high optical density, which has been emitted from the light emitting element 61, directly to the phosphor material 65 contained in the fluorescence emitting layer 67 is lowered, and the probability of incidence of this light in a dispersed state to the phosphor material 65 contained in the fluorescence emitting layer 67 is increased. Therefore, the light can be introduced in various directions from the light guiding/scattering layer 64 into the fluorescence emitting layer 67 to enhance the emission efficiency of the whole fluorescence emitting layer 67, and light having a desired uniform color can be radiated from the light emitting diode as viewed from the emission observing surface of the light emitting diode.

Sixth Preferred Embodiment

Figure 9:
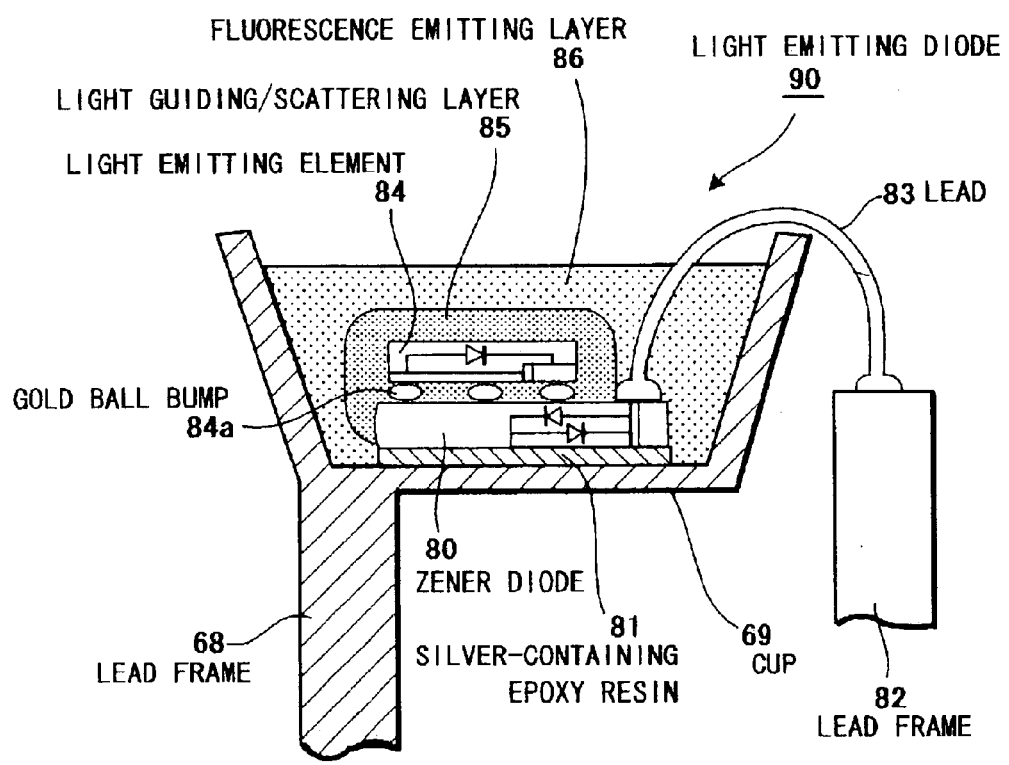
FIG. 9 is a schematic cross-sectional view showing the construction of a light emitting diode in a sixth preferred embodiment of the invention.

FIG. 9 is a schematic cross-sectional view showing the construction of a light emitting diode in a sixth preferred embodiment of the invention. In FIG. 9 showing the light emitting diode in the sixth preferred embodiment of the invention and FIGS. 7 and 8 showing the light emitting diodes in the fourth and fifth preferred embodiments of the invention, like parts are identified with the same reference numerals, and the overlapped explanation thereof will be omitted.

In a light emitting diode 90 shown in FIG. 9, a light emitting element 84 having a flip chip structure is used. The light emitting element 84 is connected in parallel to the upper surface of a Zener diode 80 through a gold ball bump 84a. The Zener diode 80 is disposed in the inner surface of a concave cup provided at the leading end of the lead frame 68 through an electrically conductive silver-mixed epoxy resin 81. Accordingly, the Zener diode 80 is electrically and mechanically connected to the cup 69 in the lead frame 68. The other end of the Zener diode 80 is connected to a lead frame 82 through a lead 83. That is, the light emitting element 84 is disposed within the cup 69 so that light emitted from the light emitting element 84 is radiated on the Zener diode 80 side and in a direction above the cup 69.

A light guiding/scattering layer 85 formed of a transparent binder (which is the same as the transparent binder 73 shown in FIG. 8) with a light scattering material (which is the same as the light scattering material 72 shown in FIG. 8) for guiding and scattering light is provided on the periphery of the light emitting element 84. The light guiding/scattering layer 85 is also provided between the Zener diode 80 and the light emitting element 84. A material, which can scatter light in a transparent synthetic resin material or a transparent synthetic rubber material, may also be used as the light scattering material. The light scattering material may of course be either partially permeable to light or fully reflect light. The concentration of the light scattering material in the light guiding/scattering layer 85 is suitably in the range of 2 to 20% by volume based on the transparent binder. However, the concentration of the light scattering material in the light guiding/scattering layer 85 as well as the thickness of the light guiding/scattering layer 85 may be properly regulated.

In FIG. 9, a transparent binder (73) having a relatively low surface tension, which can maintain the adhesion to the light emitting element 84, is used, and a light guiding/scattering layer 85 is provided so as to surround the periphery of the light emitting element 84. The thickness of the light guiding/scattering layer 85 is preferably 50 to 300 µm from the viewpoint of the contemplated effect.

A fluorescence emitting layer 86 is provided on the light guiding/scattering layer 85. The fluorescence emitting layer 86 is formed of a transparent binder (which is the same as the transparent binder 66 shown in FIG. 8) with a phosphor material (which is the same as the phosphor material 65 shown in FIG. 8) capable of giving off a predetermined color mixed thereinto. The phosphor material, the transparent binder, and the fluorescence emitting layer may be the same as those in the fourth and fifth preferred embodiments.

Thus, according to the light emitting diode 90 in this preferred embodiment, as with the fifth preferred embodiment, the light guiding/scattering layer 85 can irregularly reflect and scatter the incident light in various directions and can guide the scattered light to the fluorescence emitting layer 86. Therefore, the probability of incidence of light having high optical density, which has been emitted from the light emitting element 84, directly to the fluorescence emitting layer 86 is lowered, and light in a dispersed state is incident to the fluorescence emitting layer 86. This can realize emission of light from the whole fluorescence emitting layer 86 and thus can enhance the emission efficiency, and light having a desired uniform color can be radiated from the light emitting diode as viewed from the emission observing surface of the light emitting diode.

Further, in this preferred embodiment, the light emitting element 84 used has a flip chip structure. Therefore, light emitted upward from the light emitting element 84 is radiated directly upward through the substrate. On the other hand, light radiated downward from the light emitting element 84 is reflected from the upper surface of the Zener diode 80 and is guided upward. Therefore, the density of emitted light can be further homogenized in the light guiding/scattering layer 85, and the light is then radiated upward through the opening of the cup 69. Therefore, the brightness of light radiated from the light guiding/scattering layer 85 can be further enhanced.

For individual parts of the light emitting diode according to the invention, the construction, form, necessary number, material, size, connection relationship and the like are not limited to those in the above preferred embodiments.

The invention has been described in detail with particular reference to preferred embodiments, but it will be understood that variations and modifications can be effected within the scope of the invention as set forth in the appended claims.

What is claimed is:

1. A light emitting diode comprising:
a reflecting mirror comprising a concave part;
a light emitting element disposed within the concave part of the reflecting mirror;
a first layer comprising a phosphor material-containing light transparent material filled into a space within the concave part of the reflecting mirror to a level of an upper surface of the light emitting element disposed within the concave part of the reflecting mirror; and
a second layer comprising a phosphor material-containing light transparent material which is provided on the first layer on its emission observing surface side,
said phosphor material included in the first and second layers being operable to absorb light emitted from the light emitting element and emit light with a wavelength different from the absorbed light,
a concentration of the phosphor in the second layer being higher than a concentration of the phosphor in the first layer.

2. The light emitting diode according to claim 1, wherein the concentration of the phosphor included in the first and second layers is distributed so that values obtained by multiplying the length of optical paths, through which lights emitted from the light emitting element are passed and reach the upper surface of the second layer, by the concentration of the phosphor are substantially equal to one another.

3. The light emitting diode according to claim 1, wherein a thickness of the first layer and a thickness of the second layer satisfy a requirement that values obtained by multiplying the length of optical paths, through which lights emitted from the light emitting element are passed and reach the upper surface of the second layer, by the concentration of the phosphor are substantially equal to one another.

4. The light emitting diode according to claim 1, wherein, as viewed in cross section, an upper surface of the first layer comprises an arcuately concaved ring form between an edge of the upper surface of the light emitting element and an inner wall of the concave part of the reflecting mirror.

5. The light emitting diode according to claim 1, wherein the first layer comprises a reflecting agent which irregularly reflects light.

6. The light emitting diode according to claim 1, wherein the light emitting element comprises a flip chip-type light emitting element.

7. The light emitting diode according to claim 1, wherein the light emitting element comprises a face-up-type light emitting element and a light reflecting film is provided on the light emitting element in its fixation surface to be fixed with an adhesive.

8. The light emitting diode according to claim 1, wherein the light emitting element is fixed within the concave part of the reflecting mirror with an adhesive comprising the phosphor.

9. A light emitting diode comprising:
a reflecting mirror comprising a concave part;
a light emitting element disposed within the concave part of the reflecting mirror; and
a phosphor material-containing light transparent material layer filled into a space within the concave part of the reflecting mirror and covering the light emitting element, said phosphor material being operable to absorb light emitted from the light emitting element and emit light with a wavelength different from the absorbed light,
said phosphor material being distributed in said light transparent material layer so that values obtained by multiplying the length of optical paths, through which lights emitted from the light emitting element are passed and reach the upper surface of the light transparent material layer, by the concentration of the phosphor material are substantially equal to one another.

10. A light emitting diode comprising:
a reflecting mirror comprising a concave part;
a light emitting element disposed within the concave part of the reflecting mirror;
a transparent light guiding/scattering layer filled into a space within the concave part of the reflecting mirror and covering the light emitting element, said transparent light guiding/scattering layer being operable to scatter in various directions light emitted from the light emitting element; and
a phosphor material-containing transparent fluorescence emitting layer provided on the light guiding/scattering layer in its emission observing surface side, said phosphor material being operable to absorb light emitted from the light emitting element and passed through the light guiding/scattering layer and operable to emit light including a wavelength different from the absorbed light,
wherein the light guiding/scattering layer comprises a multilayer structure including at least two layers respectively comprising light transparent materials including different refractive indexes.

11. The light emitting diode according to claim 10, wherein the light guiding/scattering layer comprises a light transparent material including a high refractive index.

12. The light emitting diode according to claim 12, wherein the light guiding/scattering layer comprises a light scattering material-containing light transparent material layer.

13. The light emitting diode according to claim 12, wherein the light scattering material comprises at least one of aluminum oxide, titanium oxide, barium titanate, and silicon oxide.

14. A light emitting diode comprising:
a reflecting mirror comprising a concave part;
a light emitting element disposed within the concave part of the reflecting mirror;
a transparent light guiding/scattering layer filled into a space within the concave part of the reflecting mirror and covering the light emitting element, said transparent light guiding/scattering layer being operable to scatter in various directions light emitted from the light emitting element; and
a phosphor material-containing transparent fluorescence emitting layer provided on the light guiding/scattering layer in its emission observing surface side, said phosphor material being operable to absorb light emitted from the light emitting element and passed through the light guiding/scattering layer and operable to emit light including a wavelength different from the absorbed light,
wherein the light guiding/scattering layer comprises a light scattering material-containing light transparent material layer, and
wherein the concentration of the light scattering material in the light transparent material is in the range of 2 to 20% by volume based on the light transparent material.

15. A light emitting diode comprising:
a reflecting mirror comprising a concave part;
a light emitting element disposed within the concave part of the reflecting mirror;

a transparent light guiding/scattering layer filled into a space within the concave part of the reflecting mirror and covering the light emitting element, said transparent light guiding/scattering layer being operable to scatter in various directions light emitted from the light emitting element; and a phosphor material-containing transparent fluorescence emitting layer provided on the light guiding/scattering layer in its emission observing surface side, said phosphor material being operable to absorb light emitted from the light emitting element and passed through the light guiding/scattering layer and operable to emit light including a wavelength different from the absorbed light, wherein the light guiding/scattering layer comprises a light scattering material-containing light transparent material layer, and wherein the light guiding/scattering layer comprises a thickness of 50 to 300 $\mu$m.

* * * * *

UNITED STATES PATENT AND TRADEMARK OFFICE
CERTIFICATE OF CORRECTION

PATENT NO. : 6,791,116 B2
DATED : September 14, 2004
INVENTOR(S) : Yuji Takahashi et al.

Page 1 of 1

It is certified that error appears in the above-identified patent and that said Letters Patent is hereby corrected as shown below:

<u>Column 16,</u>
Lines 31-34, please correct claim 12 to read
  12. The light emitting diode according to claim 10, wherein the light guiding/scattering layer comprises a light scattering material-containing light transparent material layer.

Signed and Sealed this

Fifteenth Day of February, 2005

JON W. DUDAS
*Director of the United States Patent and Trademark Office*